United States Patent
Ngo et al.

(10) Patent No.: US 7,810,000 B2
(45) Date of Patent: Oct. 5, 2010

(54) CIRCUIT TIMING MONITOR HAVING A SELECTABLE-PATH RING OSCILLATOR

(75) Inventors: Hung C. Ngo, Austin, TX (US); Gary D. Carpenter, Austin, TX (US); Alan J. Drake, Round Rock, TX (US); Jente B. Kuang, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 618 days.

(21) Appl. No.: 11/559,436

(22) Filed: Nov. 14, 2006

(65) Prior Publication Data

US 2008/0115019 A1    May 15, 2008

(51) Int. Cl.
*G01R 31/3181* (2006.01)
*G01R 31/30* (2006.01)

(52) U.S. Cl. ...................... 714/724; 714/731
(58) Field of Classification Search .............. None
See application file for complete search history.

(56) References Cited

U.S. PATENT DOCUMENTS

| | | | | |
|---|---|---|---|---|
| 3,717,868 | A * | 2/1973 | Crawford et al. | 341/102 |
| 4,165,444 | A * | 8/1979 | Gordon | 380/44 |
| 5,329,188 | A * | 7/1994 | Sikkink et al. | 327/18 |
| 5,485,104 | A * | 1/1996 | Agrawal et al. | 326/38 |
| 5,870,404 | A | 2/1999 | Ferraiolo et al. | 371/1 |
| 6,185,706 | B1 | 2/2001 | Sugasawara | 714/724 |
| 6,188,293 | B1 | 2/2001 | Miyagi et al. | |
| 6,435,737 | B1 * | 8/2002 | Wise et al. | 712/200 |
| 6,535,735 | B2 | 3/2003 | Underbrink et al. | 323/283 |
| 6,538,522 | B1 | 3/2003 | Aipperspach et al. | 331/57 |
| 6,658,632 | B1 * | 12/2003 | Parulkar et al. | 716/4 |
| 6,701,476 | B2 * | 3/2004 | Pouya et al. | 714/727 |

(Continued)

FOREIGN PATENT DOCUMENTS

JP          04264290 A  *  9/1992    .................. 368/201

OTHER PUBLICATIONS

U.S. Appl. No. 11/225,652, filed Sep. 13, 2005, Joshi, et al.

(Continued)

*Primary Examiner*—Kevin L Ellis
*Assistant Examiner*—Dipakkumar Gandhi
(74) *Attorney, Agent, or Firm*—Mitch Harris, Atty at Law, LLC; Andrew M. Harris; Libby Z. Toub

(57) ABSTRACT

An in-circuit timing monitor having a selectable-path ring oscillator circuit provides delay and performance measurements in an actual circuit environment. A test mode signal is applied to a digital circuit to de-select a given functional input signal applied to a functional logic block within the digital circuit and replace it with feedback coupled from an output of the functional logic block, when test mode operation is selected. The signal path from the de-selected input to the output is selected so that the signal path will oscillate, and a characteristic frequency or phase of the output signal is measured to determine the delay. Other inputs to the functional logic block are set to a predetermined set of logic values. The selection may be made at a register preceding the digital inputs or made in the first level of logic of the functional logic block.

15 Claims, 4 Drawing Sheets

U.S. PATENT DOCUMENTS

| | | | |
|---|---|---|---|
| 6,909,301 B2 | 6/2005 | Korson et al. | 324/763 |
| 6,924,679 B2 | 8/2005 | Seno et al. | 327/158 |
| 6,958,659 B2 | 10/2005 | Nakajima | 331/57 |
| 7,046,094 B2 | 5/2006 | Belluomini et al. | 331/44 |
| 7,071,736 B2 | 7/2006 | Wikstrom | 326/95 |
| 7,107,558 B2 | 9/2006 | Tetelbaum et al. | 716/6 |
| 7,190,233 B2 | 3/2007 | Bhushan et al. | 331/44 |
| 7,265,590 B2 | 9/2007 | Seki et al. | 327/20 |
| 7,411,436 B2 | 8/2008 | Fang et al. | 327/262 |
| 2002/0112213 A1 | 8/2002 | Abadir et al. | 716/4 |
| 2002/0135343 A1 | 9/2002 | Underbrink et al. | 323/283 |
| 2004/0130372 A1 | 7/2004 | Seki et al. | 327/278 |
| 2005/0022145 A1 | 1/2005 | Tetelbaum et al. | 716/6 |
| 2006/0226918 A1* | 10/2006 | Belitzer et al. | 331/16 |

OTHER PUBLICATIONS

U.S. Appl. No. 11/250,019, filed Oct. 13, 2008, Joshi, et al.
U.S. Appl. No. 11/250,061, filed Oct. 13, 2008, Kuang, et al.
U.S. Appl. No. 11/260,571, filed Oct. 29, 2008, Chuang, et al.
U.S. Appl. No. 11/549,138, filed Oct. 13, 2006, Carpenter, et al.
Tschanz, et al., "Adaptive Body Bias for Reducing Impacts of Die-to-Die and Within-Die Parameter Variations on Microprocessor Frequency and Leakage", JSSC, v. 37, No. 11. Nov. 2002.
Elgebaly, et al., "Efficient Adaptive Voltage Scaling System Through On-Chip Critical Path Emulation", ISLPED 2004, pp. 375-380.

* cited by examiner

CIRCUIT TIMING MONITOR HAVING A SELECTABLE-PATH RING OSCILLATOR

This invention was made with Government support under DARPA, NBCH3039004. THE GOVERNMENT HAS CERTAIN RIGHTS IN THIS INVENTION.

BACKGROUND OF THE INVENTION

1. Technical Field

The present invention relates generally to memory circuits, and more particularly to an in-circuit ring oscillator and method for evaluating circuit performance.

2. Description of the Related Art

Timing of the various paths in a high-speed digital logic circuit has always been a necessity. However, with today's processor cycle frequencies reaching well above 4 GHz and with other logic circuits operating in the range of 5-10 GHz, the determination of variation and absolute delay of logic paths has become increasingly challenging.

High-speed digital circuits have been evaluated using ring oscillator circuits that duplicate a critical path with added feedback of the output to the input, providing a ring configuration. The test circuit is usually only implemented in non-production devices, or in production wafers either on the kerf, or the edge of the dies. The frequency at which the ring oscillator operates indicates the delay of the circuit. However, since such ring oscillator circuits are not the actual circuit, various factors reduce the accuracy of the ring oscillator test results. The test circuit may not completely duplicate the full circuit environment of the actual circuit, in that loading of circuits branching away from the critical path may be simulated by dummy loads rather than the actual branch paths. Further, the operating environment of the actual circuit will not be simulated in a test circuit. The environmental factors that are not duplicated include noise, thermal variation and signal coupling. For example, operation of the ring oscillator will typically result in a higher level of power dissipation and therefore higher temperature in contrast to normal operation, in which the path being simulated is not typically operating continuously.

It is therefore desirable to provide a ring oscillator circuit and method for evaluating a high-speed digital circuit design under conditions closely approximating actual operating conditions by using the actual logic circuit. It is further desirable to provide such a ring oscillator circuit and method that introduce a minimum of variation from the actual digital circuit design.

SUMMARY OF THE INVENTION

The objective of evaluating digital circuit designs under actual operating conditions is accomplished in a circuit that includes one or more selectable functional logic paths of a production die in a ring oscillator and a method of operation of the circuit.

The circuit is a ring oscillator formed by connecting an input of a functional digital logic block to an output of the functional digital logic block by a selection circuit that receives a test mode control signal. The control signal selects between ring oscillator operation and functional operation of the functional digital logic block by coupling the output of the functional digital logic block to an input of the digital logic block when a test mode is selected, and alternatively selecting a functional input signal when the test mode is not selected. The selector may further select from among multiple outputs of the digital logic block and/or may select from among multiple inputs of the functional digital logic block in response to further selection signals, so that multiple paths can be tested, e.g., the critical path (longest delay), the shortest path, and other circuit paths of interest. In order to support oscillation, other inputs of the functional digital logic block are set to predetermined values, either by a dedicated hardware circuit, or by existing circuit paths such as external inputs or boundary latches.

A monitoring circuit may be included to simplify measurement of the ring oscillator output. The circuit may include a pre-scaling divider to reduce the frequency of the oscillator and may also include an in-circuit counter to count oscillations. Alternatively, or provided additionally as a selectable monitoring circuit, a delay comparison circuit may be included that determines a difference between a calibrated delay and the actual delay of the critical path.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns a ring oscillator circuit for evaluating performance of a digital logic circuit, by using a signal path within a functional digital logic block to form a ring oscillator when the digital logic circuit is placed in a test mode. The input and output combination used to provide the ring oscillator test may be made selectable and the other inputs are forced to a predetermined set of logic values, so that the combination of the selected path and the other fixed inputs guarantees oscillation around the ring formed by the selected logic path. The logic may be clocked logic, or all registers in the path or in the functional block (or just in the selected path) may be rendered transparent so that any functional clock does not impede the oscillation around the path. By measuring characteristics of the oscillation such as the frequency of oscillation, relative frequency with respect to a functional clock or the phase of the oscillation with respect to the functional clock, the delay of the selected path may be determined. In general, it is desirable to measure the shortest delay to ensure that signals do not arrive and disappear too early, and the longest delay or "critical path", which generally determines the minimum operating period/maximum performance for the circuit.

Figure 1:
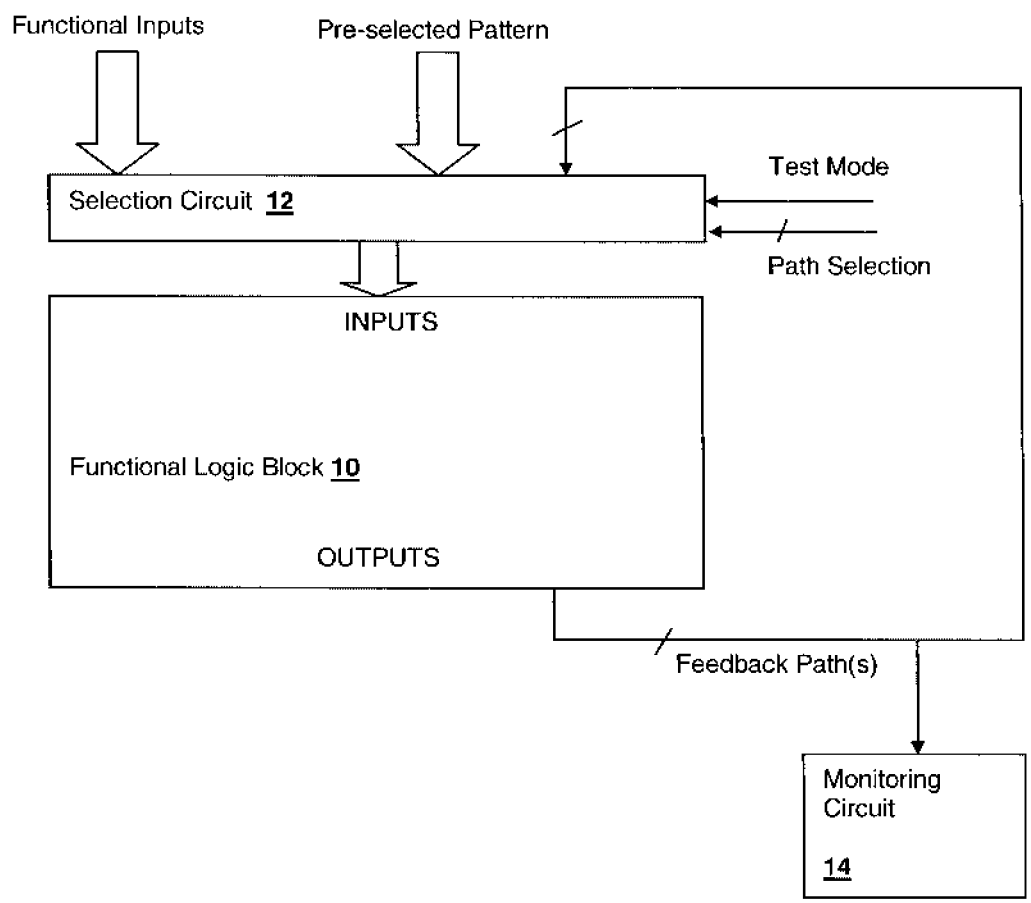
FIG. 1 is a block diagram of a functional digital logic circuit including a selectable path ring oscillator circuit in accordance with an embodiment of the invention.

With reference now to the figures, and in particular with reference to FIG. 1, a digital circuit in accordance with an embodiment of the invention is shown. A functional logic block 10 of the digital circuit is coupled to a selection circuit 12 that selects between a functional operating mode of functional logic block 10 and a test mode, in which a ring oscillator is formed from an output of functional logic block 10 and one of the inputs of functional logic block 10. A Test Mode signal is provided, generally from a latch or register within the digital circuit that may be set and reset via boundary scan or other suitable technique. A de-asserted state of the signal Test Mode causes operation in a functional operating mode of functional logic block 10. By functional operating mode of functional logic block 10, what is meant is a mode that performs a function for which functional logic block 10 is designed to perform when the depicted digital circuit is operating according to its intended use, other than the test mode provided in embodiments of the present invention. An asserted state of the signal Test Mode causes operation of the above-described ring oscillator and optional selection of a particular path for oscillation. Further, signal Test Mode causes selection circuit 12 to assert a predetermined set of digital values at each of the inputs other than the given input of the path used to form the ring oscillator. One or more Path Selection signals can be provided to selection circuit 12 for selecting among inputs and/or outputs of functional logic block 10 to form a ring oscillator.

The input/output combination(s) used to form the ring oscillator, as well as the predetermined logic values to impose at the other inputs of functional logic block 10 is determined from a logical analysis so that the condition of oscillation is supported: the selected path through functional logic block 10 must yield a net inversion when the other inputs are set to the their corresponding predetermined logic values. Timing analysis may also be performed to determine the "critical" and shortest timing path, or those paths may be discovered through the mechanism of the present invention. An optional monitoring circuit 14 may be included within the digital circuit of the depicted embodiment, for pre-processing and/or extracting timing information from the ring oscillator signal.

Figure 2A:
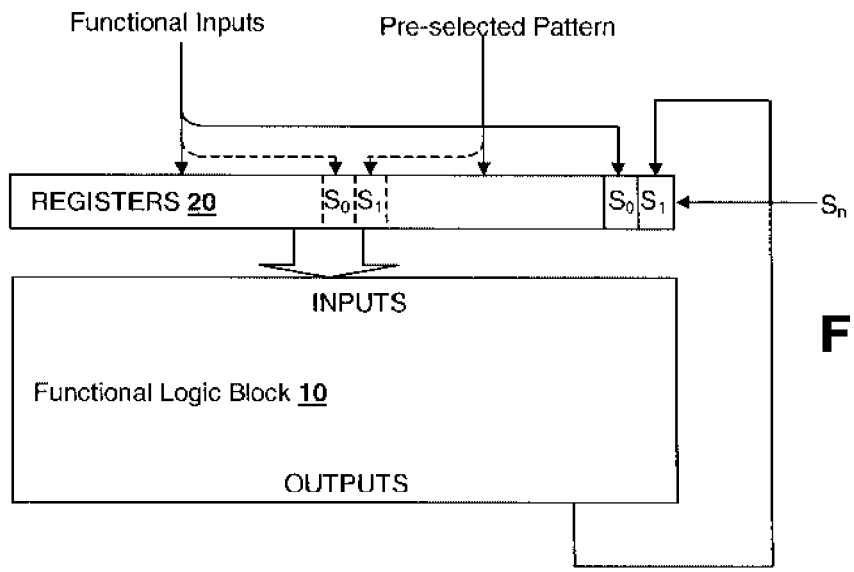
FIGS. 2A-2C are schematic diagrams depicting input path selection circuits in accordance with embodiments of the present invention.
Figure 2B:
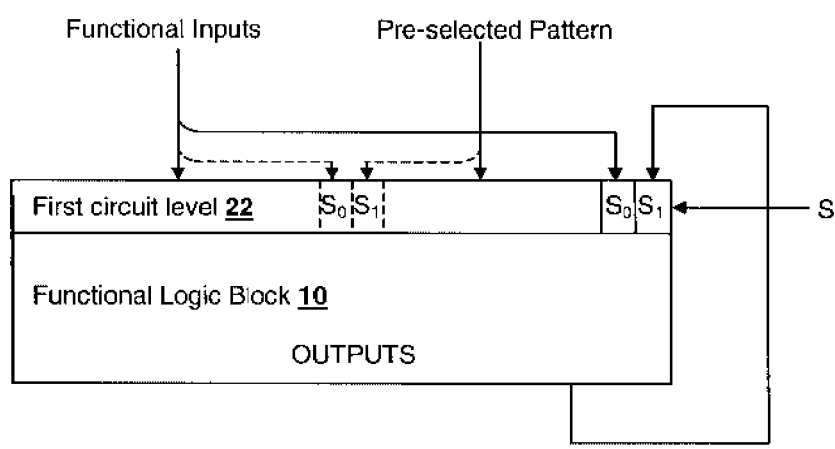
Figure 2C:
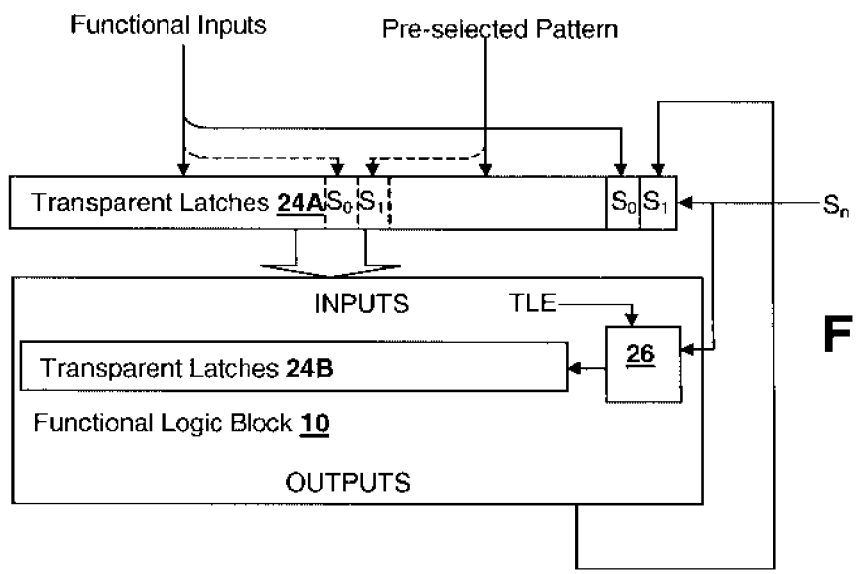

Referring now to FIGS. 2A-2C, details of selection circuit 12 of FIG. 1 in accordance with various embodiments of the invention are shown. FIG. 2A shows a circuit in accordance with an embodiment of the invention, in which the selection circuit is implemented in multiplexing registers 20 that provide input signals to functional logic block 10 in both the functional operating mode and test mode. A selection signal $S_n$ selects between input cells $S_0$ in the functional operating mode and input cells $S_1$ when the circuit is in test mode. Selection signal $S_n$ can be provided directly from the Test Mode signal, or if additional input cells $S_2$ implementing other path selections for other output signals provided as feedback or with the feedback applied to other digital inputs of functional logic block 10, signal $S_n$ may include multiple signals for selection between more than two cells at each input position of multiplexing registers 20.

FIG. 2B shows a circuit in accordance with another embodiment of the invention, in which the selection circuit is implemented in a first logic circuit level 22 of functional logic block 10. Selection signal $S_n$ is then provided to selectors within first logic circuit level 22 then combinatorially performs selection between input cells $S_0$ in the functional operating mode and input cells $S_1$ when the circuit is in test mode. As in the embodiment of FIG. 2A, selection signal $S_n$ can be provided directly from the Test Mode signal, or if additional input cells $S_2$ implementing other path selections for other output signals provided as feedback, or with the feedback selected from other digital inputs of functional logic block 10, signal $S_n$ may include multiple signals for selection between more than two cells at each input position of functional logic block 10.

FIG. 2C shows a circuit in accordance with yet another embodiment of the invention, in which the selection circuit is implemented in transparent latches 24A having outputs providing the input signals to functional logic block 10. Other transparent latches 24B within functional logic block are enabled by selection signal $S_n$ along with transparent latches 24A so that clocks such as signal TLE, which enables transparent latches 24B in functional operating mode, are prevented from clocking transparent latches 24B and rendered transparent when the depicted digital circuit is in test mode. A clock selector 26 selects between signal TLE in functional operating mode and a logic level that renders transparent latches 24B transparent in test mode. As a result, the ring oscillator can oscillate at the maximum frequency possible due to the delay through the selected path through functional logic block 10 and any delay through transparent latches 24A. In the embodiments of FIGS. 2A-2B, if any clocked registers are present in the data flow, then the path delay will also be dependent on the clock(s).

Figure 3A:
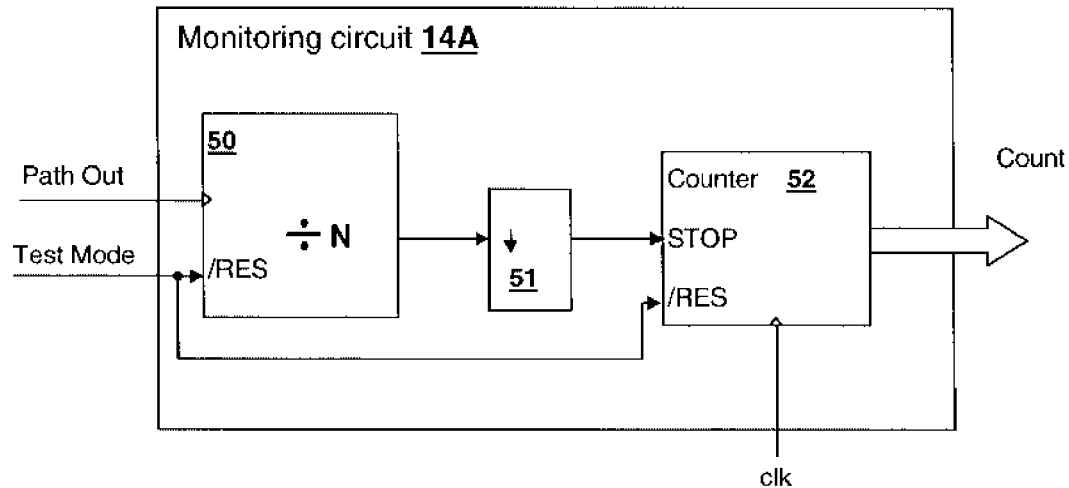
FIGS. 3A-3B are schematic diagrams of monitoring circuits in accordance with embodiments of the present invention.

Referring now to FIG. 3A, details of monitoring circuit 14 of FIG. 1 are shown as a monitoring circuit 14A in accordance with an embodiment of the invention. A Path Out signal is provided from the output of the selected path through functional logic block 10, which is the ring oscillator signal. A divider 50 divides the Path Out signal by a predetermined factor N, and edge triggered flip-flop 51 generates a signal to stop a second counter 52 that is clocked by a functional clk signal. Second counter 52 and first counter 50 are reset by the Test Mode signal, so that when test mode commences, a Count output value is provided that represents the number of functional clocks that occur in N cycles of the ring oscillator output. The Count output value is equal to $f_{RO}*N/f_{clk}$, where $f_{RO}$ is the frequency of oscillation of the ring oscillator output and $f_{clk}$ is the frequency of the clk signal. The depicted circuit is particularly useful where the frequency of the ring oscillator is lower than that of the clk signal, but with proper selection of N, can be used for higher frequency ring oscillator outputs.

Figure 3B:
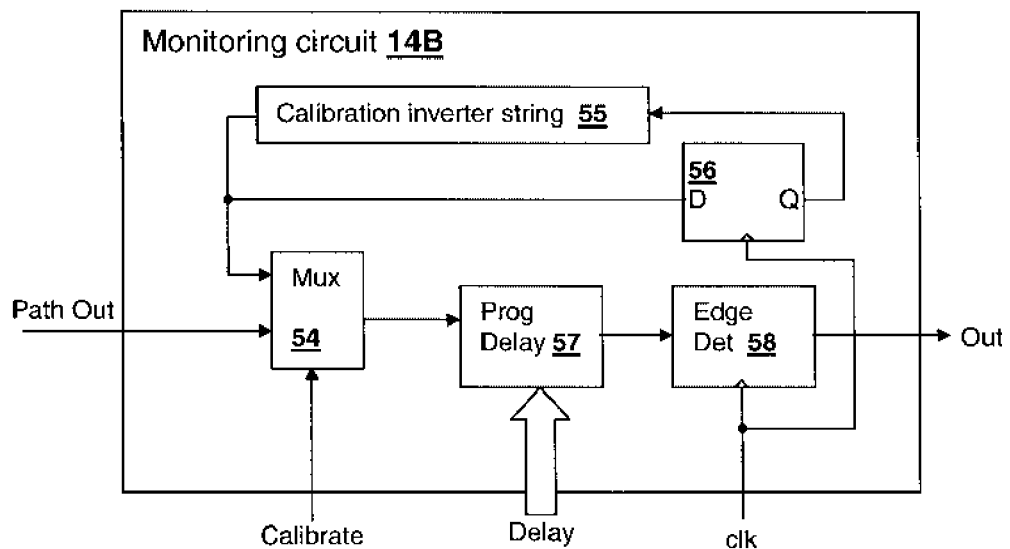

Referring now to FIG. 3B, details of monitoring circuit 14 of FIG. 1 are shown as a monitoring circuit 14B in accordance with another embodiment of the invention. The Path Out signal is applied through a multiplexer 54 to a programmable delay 57 which supplies an output signal to an edge detector 58. Edge detector 58 is clocked by the functional clk signal, providing an output signal that has a pulse width corresponding to the delay between the Path Out signal and the functional clk signal. The depicted circuit is thus suitable for circuits in which the ring oscillator period is very close to or shorter than that of the clk signal period, which will occur when functional logic block 10 has a single synchronous element and a short selected ring oscillator path or when there is no synchronous element, but the path length is close to the period of the clk signal.

A calibration circuit is included that provides a calibration ring oscillator consisting of calibration inverter string 55 and latch 56, which is clocked by clock signal clk. A calibrate signal causes multiplexer 54 to select the output of the calibration ring oscillator (which is a circuit having a single synchronous element: latch 56), when the calibration mode is selected. A comparison of the pulse width at the output of edge detector 58 between calibration mode (calibrate signal asserted) and test mode (calibrate signal de-asserted) provides a measure of the delay of the selected through functional logic block 10 given a known delay of calibration inverter string 55 and latch 56, and programmable delay 57 can be adjusted in accordance with measured results to further calibrate the pulse width measurement for both the calibrate and test modes for external measurement.

Figure 4:
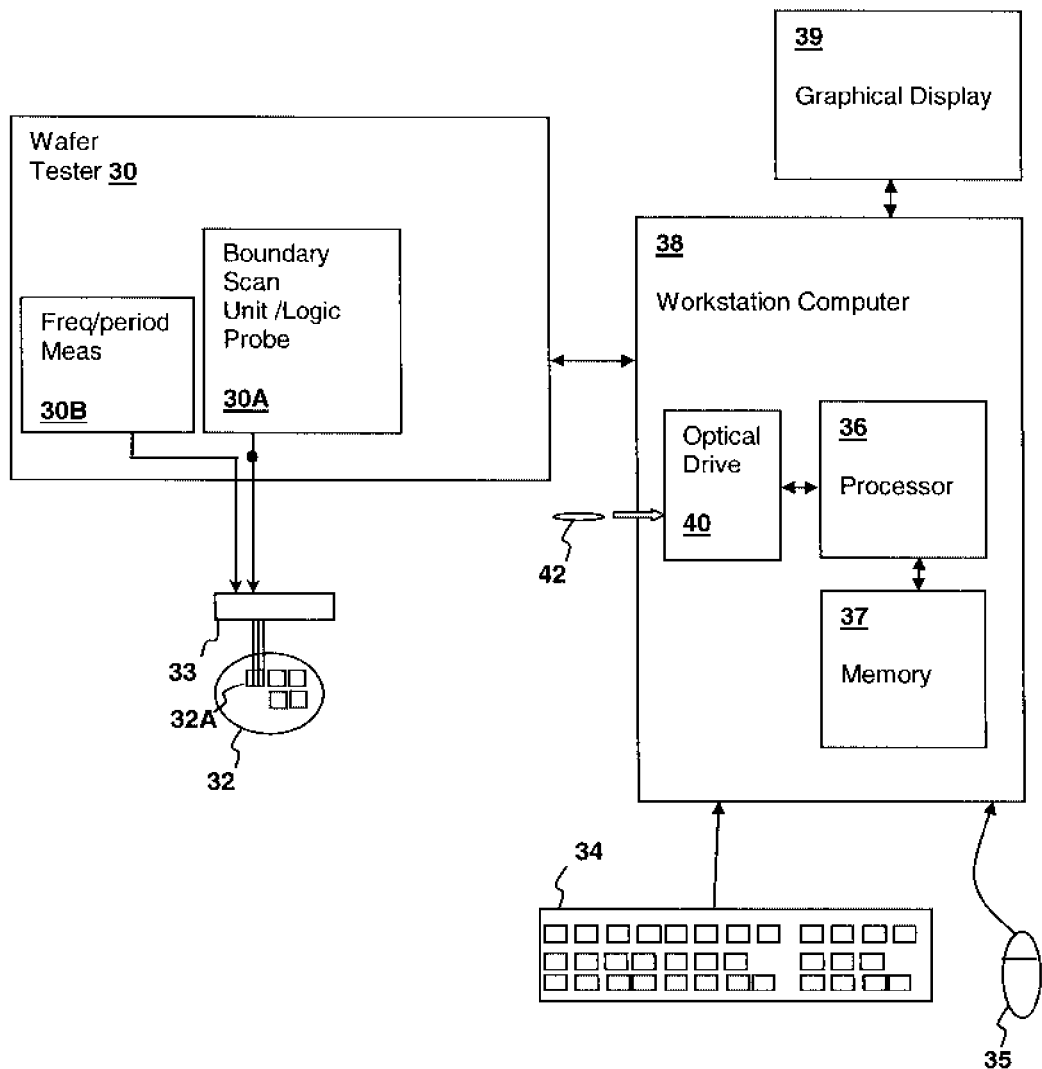
FIG. 4 is a block diagram of a wafer test system that may be used in performing methods in accordance with embodiments of the present invention.

Referring now to FIG. 4, a wafer test system, in which methods according to an embodiment of the present invention are performed, is depicted. A wafer tester 30 includes a boundary scan unit 30A, for providing control of selection circuit 12 and functional logic block 10 as described above when integrated on a die 32A on a wafer under test 32. An electrical interface is provided via a probe head 33 having electrical test connections to die 32A. Wafer tester 30 includes a frequency/period measurement unit 30B, that evaluates a frequency and/or pulse width of the ring oscillator and/or outputs of monitoring circuit 14.

A workstation computer 38, having a processor 36 coupled to a memory 37, for executing program instructions from memory 37, wherein the program instructions include program instructions for providing control inputs to and taking measurements of the outputs of circuits within wafer 32. Workstation computer 38 includes an optical drive 40 for reading optical media 42 that includes computer program products comprising program instructions for carrying out methods in accordance with embodiments of the present invention. Workstation computer 38 is coupled to wafer tester 30 for controlling the measurements and collecting data, such as the above described pulse width and/or frequency measurement data. The data produced by embodiments of the present invention are collected from multiple tests of functional logic blocks 10. Data from ring oscillator tests as performed in accordance with embodiments of the invention are transferred to workstation computer 38 via wafer tester 30 and stored in memory 37 and/or other media storage such as a hard disk. Workstation computer 38 is also coupled to a graphical display 39 for displaying program output such as the results of memory tests described hereinafter. Workstation computer 38 is further coupled to input devices such as a mouse 35 and a keyboard 34 for receiving user input. Workstation computer may be coupled to a public network such as the Internet, or may be a private network such as the various "intra-nets" and software containing program instructions for analyzing data produced by methods and circuits in accordance with embodiments of the present invention may be located on remote computers or locally within workstation computer 38. Further, workstation computer 38 may be coupled to wafer tester by such a network connection.

While the system of FIG. 4 depicts a configuration suitable for sequential test of a plurality of dies on a wafer, the depicted system is illustrative and not limiting to the present invention. Probe head 33 may be a multi-die full wafer probe system, or may comprise multiple probe heads for simultaneously testing multiple wafers on a single or multiple die basis. Additionally, while boundary data retrieval and stimulus is illustrated, the techniques of the present invention may also be applied to other interfaces available to probe wafer 32, or applied to circuits implemented in fully functional dies where data extraction is performed over a serial or parallel bus or other interface.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A digital logic circuit integrated on a die, comprising:
   a functional logic block operable in a functional operating mode of said digital logic circuit, said functional logic block having a plurality of inputs for receiving corresponding digital input signals and at least one digital output generated in conformity with a logical combination of values of at least two of the digital input signals;
   a selector circuit responsive to a test mode control signal, wherein said selector circuit de-selects a corresponding one of said at least two digital input signals from one of said plurality of inputs and couples a feedback one of said at least one digital output to said one of said plurality of inputs when said test mode control signal indicates a test mode is selected, wherein a given signal path through said functional logic block oscillates at a frequency dependent on a delay of said given signal path when said test mode is selected, whereby said delay can be determined by measuring a characteristic of oscillation of said given signal path when said test mode is selected, and wherein said selector circuit further de-selects said at least two input signals when said test mode is selected, and asserts predetermined logic values for said at least two digital input signals other than said one of said plurality of inputs;
   a monitoring circuit having an input coupled to said feedback output, for producing an indication in response to said oscillation, wherein said monitoring circuit comprises an edge detector having a clock input coupled to a functional clock of said digital logic circuit, and a signal input coupled to said feedback output, and an adjustable delay coupled between said signal input and said feedback output, whereby said edge detector provides an indication of a delay between an edge of said functional clock and an edge of said oscillation;
   a calibration delay line for providing a predetermined delay;
   a calibration latch coupled between an output of said delay line and an input of said delay line and having a clock input coupled to said functional clock; and
   a multiplexer having a select input coupled to a calibrate mode selection signal, a first input coupled to said feedback output, a second input coupled to an output of said calibration delay line and an output coupled to an input of said adjustable delay, whereby said edge detector provides an indication of a delay between an edge of said functional clock and an edge of a calibration oscillation occurring through said calibration delay line when said calibrate mode selection signal is asserted.

2. The digital logic circuit of claim 1, wherein said selector circuit is further responsive to at least one input selection control signal, wherein said selector circuit selects said input from among said plurality of inputs in accordance with said input selection control signal.

3. The digital logic circuit of claim 1, wherein said at least one digital output is a plurality of digital outputs, wherein said selector circuit is further responsive to at least one output selection control signal, and wherein said selector circuit selects said feedback output from among said plurality of digital outputs in accordance with said output selection control signal.

4. The digital logic circuit of claim 1, wherein said selector circuit comprises a multiplexing register for providing said plurality of digital input signals as synchronous signals synchronized by a functional clock signal, wherein a first set of inputs of said multiplexing register are selected in response to de-assertion of said test mode control signal and are coupled to functional input signals of said digital logic circuit, wherein a second set of inputs of said multiplexing register is selected when said test mode control signal is asserted, and wherein said second set of inputs includes an input coupling said feedback output to said one of said plurality of inputs, and wherein a remainder of said second set of inputs are set to predetermined states.

5. The digital logic circuit of claim 1, wherein said selector circuit is included within a first circuit level of said functional logic block, wherein said first circuit level of said functional logic block includes a control input for receiving said test mode control signal, wherein said first circuit level selector applies resultant values in accordance with a state of said plurality of digital input signals to a subsequent stage of said functional logic block when said test mode control signal is de-asserted, and wherein said first circuit level applies a resultant value of said feedback output to said subsequent stage when said test mode control signal is asserted.

6. The digital logic circuit of claim 1, wherein said functional logic block includes at least one latch interposed along the signal path between a first logic circuit and a second logic circuit and controlled by a clock signal, and wherein said at least one latch is further coupled to said test mode control signal, wherein said at least one latch is rendered transparent when said test mode control signal is asserted, whereby said oscillation of said given signal path is unconstrained by said clock signal.

7. A method of measuring delay of a signal path in a digital circuit integrated on a die, comprising:
  receiving a signal indicating a selection between a test mode and a functional mode of operating said digital circuit;
  responsive to receiving a signal indicating selection of said test mode, selectively coupling a feedback one of the plurality of inputs of a functional digital logic block of said digital circuit to an output signal generated by said functional digital logic block, wherein the functional digital logic block receives the plurality of digital input signals and generates the output signal in conformity with a logical combination of values of at least two of said digital input signals, and wherein a given signal path from said input through said functional logic block to said output oscillates at a frequency dependent on a delay of said given signal path;
  responsive to receiving said signal indicating selection of said functional mode, selectively coupling said input of said functional digital logic block to a corresponding one of the digital input signals provided for operating said functional digital logic block;
  responsive to receiving said signal indicating selection of said test mode, forcing the plurality of inputs of said functional digital logic block other than the feedback input to predetermined logic values;
  further responsive to receiving said signal indicating selection of said test mode, measuring a characteristic of oscillation of said given signal path to determine said delay using a monitoring circuit that measures a difference between edges of a functional clock of said digital logic circuit and edges of the output signal;
  providing a adjustable delay between the feedback input and the output signal; and
  calibrating the adjustable delay in a calibration mode by selecting between the output signal and the output of a calibration delay line providing a predetermined delay, so that the output of the calibration delay line is selected in the calibration mode, wherein the calibration delay line output is coupled to a calibration delay line input so that the calibration delay line oscillates;
  latching a value on a signal path between the calibration delay line output and the calibration delay line input in conformity with an edge of the functional clock, whereby the measuring is further performed during the calibration mode and the adjustable delay adjusted in conformity with a result of the measuring during the calibration mode.

8. The method of claim 7, wherein said functional digital logic block includes a plurality of digital inputs, and further comprising selecting said feedback input of said functional digital logic block from among said plurality of digital inputs in response to at least one selection signal.

9. The method of claim 7, wherein said functional digital logic block includes a plurality of digital outputs, and further comprising selecting said output of said functional digital logic block from among said plurality of digital outputs in response to at least one selection signal.

10. The method of claim 7, further comprising responsive to receiving said signal indicating selection of said test mode, enabling at least one transparent latch within said functional digital logic block and disposed along the given signal path, whereby said oscillation of said given signal path is unconstrained by a clock signal.

11. The method of claim 7, wherein said selectively coupling said feedback input of said functional digital logic block of said digital circuit to an output of said functional digital logic block is performed in a first logic level of said functional digital logic block.

12. A digital logic circuit integrated on a die, comprising:
  a functional logic block operable in an operating mode of said digital logic circuit, said functional logic block having a plurality of inputs for receiving corresponding digital input signals and at least one digital output generated in conformity with a logical combination of values of at least two of the digital input signals;
  means for selectively coupling a feedback one of said plurality of inputs to a feedback one of said digital outputs in a test mode, wherein a given signal path through said functional logic block oscillates at a frequency dependent on a delay of a given signal path through said functional logic block, whereby a delay of said given signal path can be determined by measuring a characteristic of oscillation of said given signal path when said test mode is selected;
  means for forcing the plurality of inputs other than the feedback input to assume predetermined logical values when the digital logic circuit is in the test mode;
  a monitoring circuit having an input coupled to said feedback output, for producing an indication in response to said oscillation, wherein said monitoring circuit comprises an edge detector having a clock input coupled to a functional clock of said functional logic block, and a signal input coupled to said feedback output, and an adjustable delay coupled between said signal input and said feedback output, whereby said edge detector provides an indication of a delay between an edge of said functional clock and an edge of said oscillation;
  a calibration delay line for providing a predetermined delay;

a calibration latch coupled between an output of said delay line and an input of said delay line and having a clock input coupled to said functional clock; and a multiplexer having a select input coupled to a calibrate mode selection signal, a first input coupled to said feedback output, a second input coupled to an output of said calibration delay line and an output coupled to an input of said adjustable delay, whereby said edge detector provides an indication of a delay between an edge of said functional clock and an edge of a calibration oscillation occurring through said calibration delay line when said calibrate mode selection signal is asserted.

13. The digital logic circuit of claim 12, further comprising means for selecting said feedback input from among said plurality of inputs.

14. The digital logic circuit of claim 12, further comprising means for selecting said feedback output from among a plurality of outputs of said functional logic block.

15. The digital logic circuit of claim 12, further comprising means for permitting latches disposed along the given signal path to allow the oscillation.

* * * * *